United States Patent [19]

Kazem-Goudarzi et al.

[11] Patent Number: 5,540,379
[45] Date of Patent: Jul. 30, 1996

[54] SOLDERING PROCESS

[75] Inventors: Vahid Kazem-Goudarzi, Sunrise; Henry F. Liebman, Tamarac; Kingshuk Banerji, Plantation; William B. Mullen, III, Boca Raton; Edwin L. Bradley, III, Sunrise, all of Fla.

[73] Assignee: Motorola, Inc., Schaumburg, Ill.

[21] Appl. No.: 236,611

[22] Filed: May 2, 1994

[51] Int. Cl.⁶ ..................................................... H05K 3/34
[52] U.S. Cl. ................... 228/248.5; 228/227; 228/233.2; 427/123
[58] Field of Search .......................... 228/180.21, 180.22, 228/224, 227, 233.2, 248.5; 427/123

[56] References Cited

U.S. PATENT DOCUMENTS

| | | | |
|---|---|---|---|
| 3,292,240 | 12/1966 | McNutt et al. | 29/840 |
| 3,900,153 | 8/1975 | Beerwerth et al. | 228/248.5 |
| 4,471,026 | 9/1984 | Nicholas et al. | 228/121 |
| 4,493,451 | 1/1985 | Clark et al. | 228/248.5 |
| 4,519,537 | 5/1985 | Heinrich et al. | 228/248.5 |
| 4,740,252 | 4/1988 | Hasegawa et al. | 228/248.1 |
| 4,995,546 | 2/1991 | Regnault | 228/254 |
| 5,024,372 | 6/1991 | Altman et al. | 228/248 |
| 5,154,341 | 10/1992 | Melton et al. | 228/180.2 |
| 5,221,038 | 6/1993 | Melton et al. | 228/197 |
| 5,229,070 | 7/1993 | Melton et al. | 228/207 |
| 5,233,504 | 8/1993 | Melton et al. | 361/760 |
| 5,400,953 | 3/1995 | Maeno | 228/248.1 |

OTHER PUBLICATIONS

"New Techniques Eliminate Solder Paste From Printed Circuit Assembly Operation," Holzmann, D. and Payne, B., Mask Technology, Inc., Santa Ana, Ca, Surface Mount International Conference and Exposition, Proceedings of the Technical Program, San Jose, California, Sep., 1992.

"SIPAD—A New Reflow Soldering Method for SMD's using a Solid Solder Deposit," Maiwald, W., Siemens AG, Munich, Germany, Surface Mount International Conference and Exposition, Proceedings of the Technical Program, San Jose, California, Aug., 1991.

Primary Examiner—Samuel M. Heinrich
Attorney, Agent, or Firm—Dale W. Dorinski

[57] ABSTRACT

A soldering process using two different types of solder alloys is disclosed. The first solder alloy (115) undergoes a solid-to-liquid transition at a first temperature. The second solder alloy (120) undergoes this solid-to-liquid transition at a second temperature, the second temperature being greater than the first temperature. The soldering composition is deposited (20) on a substrate (100) having solderable portions (105) and is heated to a temperature that is above the first temperature but below the second temperature (32). During this time, the first solder alloy liquifies, while the second solder alloy remains solid. The soldering composition is subsequently cooled (40) to solidify the first solder material. A part or electronic component is added (80) to the solidified solder material and the solder materials is again heated above the second temperature (30) in order to reflow the solder and form a metallurgical bond between the substrate and the electronic component.

22 Claims, 4 Drawing Sheets

SOLDERING PROCESS

CROSS REFERENCE TO RELATED APPLICATIONS

This application is related to U.S. patent application Ser. No. 08/236,614, filed May 2, 1994 entitled "Multiple Alloy Solder Preform" by William B. Mullen, III, Kingshuk Banerji, Edwin L. Bradley, III, and Vahid Kazem-Goudarzi, and U.S. patent application Ser. No. 08/236,615, filed May 2, 1994 patent application entitled "Solder Clad Substrate," by Vahid Kazem-Goudarzi, Edwin L. Bradley, III, Kingshuk Banerji, and Henry F. Liebman, both of which are filed concurrently herewith and assigned to Motorola, Inc.

TECHNICAL FIELD

This invention relates in general to a method of soldering and more particularly to a method of soldering utilizing solder materials having more than one melting temperature.

BACKGROUND

Soft solder is a fusible alloy, typically consisting of tin and lead, which is used for the purpose of joining together two or more metals at temperatures below their melting points. In addition to tin and lead, solders may occasionally contain varying amounts of other materials, such as antimony, bismuth, cadmium, or silver, which are typically added for the purpose of varying the physical properties of the alloy. However, in many solders, some of these elements, notably antimony, are only present as impurities. Solder is widely used in the electronics industry for attaching electrical components to printed circuit boards. Printed circuit boards typically have an electrical conductor pattern consisting of a thin metal sheet, etched to form the pattern. In order to successfully attach the electrical components to the printed circuit board, there must be a metallurgical affinity between the two metals that are going to be soldered together, the metals should be free from contamination, there must be complete and adequate metallic contact between the solder and the metals that are to be soldered, and there must be a temperature adequate for sufficient alloying of the metal. The solder provides the attachment by virtue of an intermetallic solution, which takes place at the soldering temperature.

One technique used to assemble electronic assemblies is to screen print a solder paste, (consisting of flux, vehicle, and alloy), onto the board, place the component in the wet solder paste, and then reflow the solder paste to join the component to the PCB. However, screen printing lacks the flexibility required in today's build-to-order assembly factories, and results in solder voids after reflow, degrading the solder joint strength.

Another method of assembling electronic assemblies is by a process known as solder cladding or solid solder deposition. This is done by screen printing and reflowing a solder paste on the solderable surfaces of a printed circuit board (PCB) during the PCB fabrication. The advantage of this method is that the electronic components can then be placed directly on the PCB, without having to print solder paste. One of the disadvantages of this method is that the solder that is clad onto the PCB results in a highly domed surface on the solder pads that degrades the accuracy of component placement. The parts and flux tend to slide off of the domed surface when they are placed, and while the circuit board is subjected to accelerations moving down the assembly line. Some have attempted to solve this problem by reducing the amount of solder clad onto the solder pad, thus decreasing the curvature of the domed surface. However, reducing the volume of solder decreases the total wetting forces of the solder, reducing the desirable tendency of the components to self-center during the assembly reflow operation. This self-centering tendency is extremely important to assure accurate alignment and high-yield soldering. In addition, it is desirable to maximize the amount of solder deposited on the board during the cladding process in order to create a full solder fillet between the component and the PCB. Still others have attempted to eliminate the domed pads by flattening the pad after the solder is deposited, as in the OPTIMASK® method developed by DuPont and the SIPAD process developed by Siemans AG. In both cases, additional steps of flattening the domed pad are required.

Clearly, it would be a benefit to the electronics industry if a method of soldering could be devised that includes the advantages of both solder cladding and solder printing, but avoids the disadvantages of both processes.

SUMMARY OF THE INVENTION

Briefly, according to the invention, a soldering process using a solderable composition made from two or more different solder alloys is disclosed. The first solder alloy undergoes a solid-to-liquid transition at a first temperature. The second solder alloy undergoes this solid-to-liquid transition at a second temperature, the second temperature being greater than the first temperature. The soldering composition is deposited on a substrate having solderable portions and is heated to a temperature that is above the first temperature but below the second temperature. During this time, the first solder alloy liquifies, while the second solder alloy remains solid. The soldering composition is subsequently cooled to solidify the first solder material.

In alternate embodiments of the invention, a part or electronic component is added to the solidified solder material and the solder material is again heated above the first temperature in order to reflow the first solder alloy and form a metallurgical bond between the substrate and the electronic component.

In still further embodiments, during the process of soldering the component to the substrate, the soldering composition may be heated to or in excess of the higher temperature, thereby melting or liquifying both solder alloys and forming a metallurgical bond between the substrate and the part.

And in still further embodiments, a flux is used during the process of soldering the part to the substrate.

DETAILED DESCRIPTION OF THE PREFERRED EMBODIMENT

Figure 1:
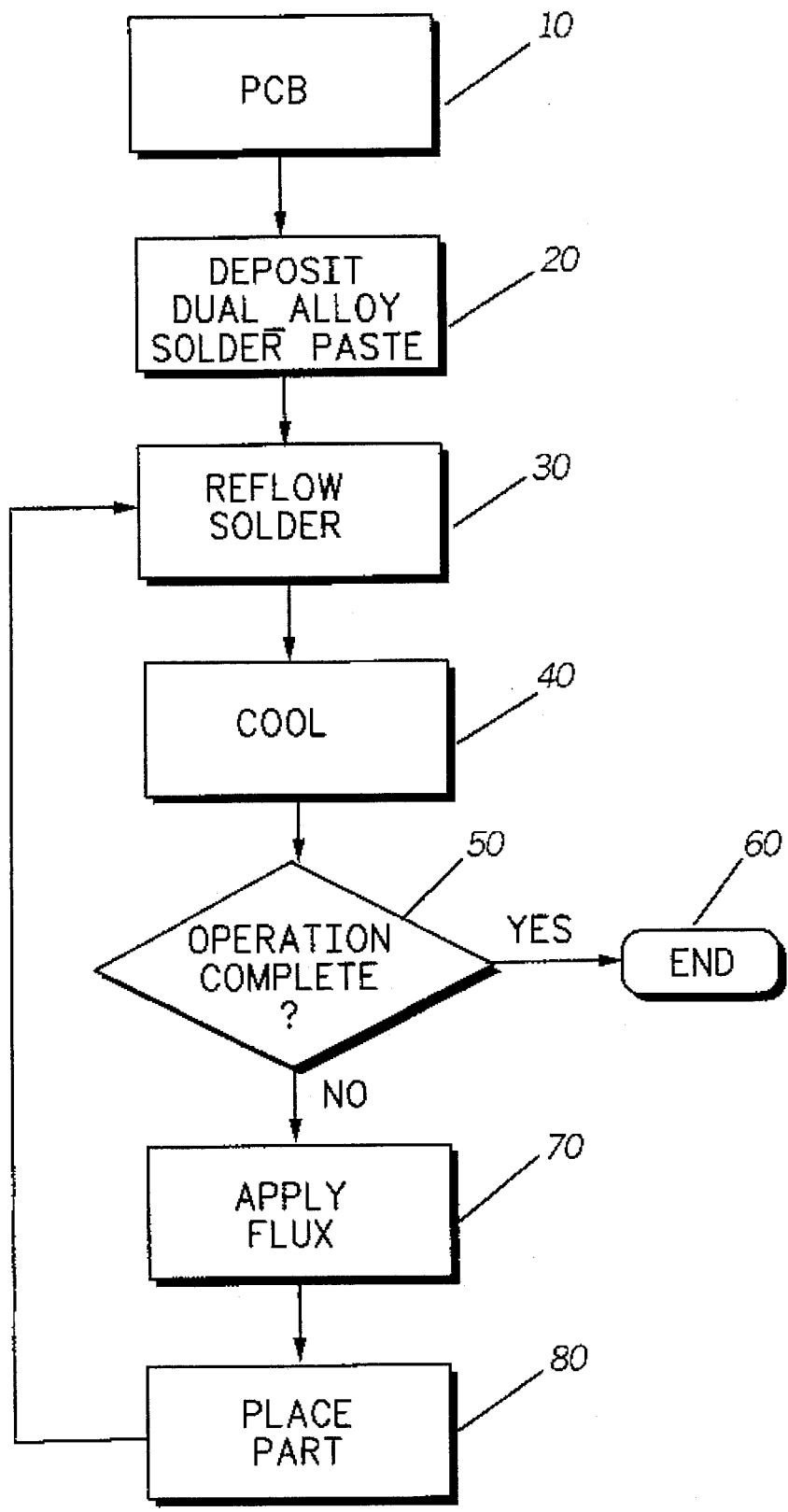
FIG. 1 is a flow chart showing the steps involved in the soldering process in accordance with the invention.

While the specification concludes with claims defining the features of the invention that are regarded as novel, it is believed that the invention will be better understood from a consideration of the following description in conjunction with the drawing figure.

Most solders are alloys of tin and lead. Pure lead melts at 327° C. and pure tin melts at 232° C. When these two metals are alloyed, the alloy has a lower melting point than either of the individual components. Depending upon the percentage composition of the tin and lead, the melting point will vary. However, there is one alloy having a composition of 63% tin and 37% lead, known as the eutectic composition, that has the lowest melting point (183° C.) of any of the possible mixtures. This eutectic composition has the characteristic of having a sharp and distinct melting point precisely at this temperature. That is, the solder alloy undergoes a phase change from solid to liquid at this point. All other compositions of tin and lead, other than the eutectic, are mixtures which do not melt sharply at any one temperature, but which pass through an intermediate range of plasticity in cooling from the liquid to the solid state. In fact, it is traditional for metallurgical purposes to consider tin-lead solder not as an alloy of tin and lead, but rather as a eutectic alloy plus lead, or a eutectic alloy plus tin, as the case may be.

These various alloys that pass through an intermediate range of plasticity are said to have a melting range. At temperatures above the melting range, the alloy is a liquid. Below the melting range, the alloy is a solid. However, at temperatures within the melting range, it is a plastic-like material that cannot be defined strictly as a liquid nor as a solid. The lower temperature of the melting range is known as the solidus temperature, and the upper temperature of the melting range is known as the liquidus temperature. At temperatures below the solidus temperature, the alloy is a solid, and at temperatures above the liquidus temperature, the alloy is a liquid. Materials other than tin and lead may be added to the alloy and will cause similar types of behavior. Examples of some materials are aluminum, antimony, arsenic, bismuth, cadmium, copper, indium, iron, nickel, silver, and zinc. Because many solder alloys exhibit a melting range rather than a pure melting point, a great deal of confusion exists over exactly what point may be considered to be the melting point of solder. For purposes of this invention, the melting point of a solder is considered to be that point at which the alloy transitions from a solid either to a liquid or to a plastic type composition; that is the melting point may be considered to be equivalent to the lower end of the melting range, or the solidus point.

This invention provides a substantially flat solder surface on the solderable portions of a printed circuit board, and can be used in both single-sided and double-sided printed circuit assemblies. It improves the quality of electronic assemblies made using automated placement systems. Typically, the manufacturer of the printed circuit board adds the solder to the printed and etched board during the fabrication process. In the preferred embodiment of the invention, a soldering method uses a dual alloy solder paste applied to the solderable surfaces of the printed circuit board. The dual alloy solder paste or soldering composition is made from powders of two different solder alloys. Each of the alloys has a melting point or range that is unique from the other. In the preferred embodiment of the invention, the metallic portion of the solder paste consists of a mixture of 88% by weight of a tin-lead-silver alloy (melting point 179°–181° C.) and 12% by weight of a tin-lead-bismuth alloy (melting range 144° C.–163° C.). The tin-lead-silver alloy is about 62% tin, 36% lead, and 2% silver, whereas the tin-lead-bismuth alloy is about 43% tin, 43% lead, and 14% bismuth. Each solder alloy is in the form of finely divided particles (such as spheres or irregularly shaped particles), typically in the size range of 200–500 mesh. These particles are frequently referred to as 'solder powder'. The mixture of powder made from the two alloys is typically suspended in a matrix of a vehicle and a fluxing agent, to aid in the printing and reflow processes. The tin-lead-bismuth solder alloy is referred to as the low temperature alloy, and the tin-lead-silver alloy is referred to as the high temperature alloy, since its melting range is above the other alloy. Although the preferred embodiment employs two solder alloys, three or more distinct alloys, for example, could be mixed and still be considered to be within the spirit and scope of the invention. In addition, the ratios or amounts of each alloy could also be modified depending on the metallurgical composition of each material, or pure forms of metal could be used instead of alloys. In other embodiments, alloys of elements such as tin, lead, bismuth, indium, copper, antimony, cadmium, arsenic, aluminum, gallium, gold, silver may also be used.

Figure 2:
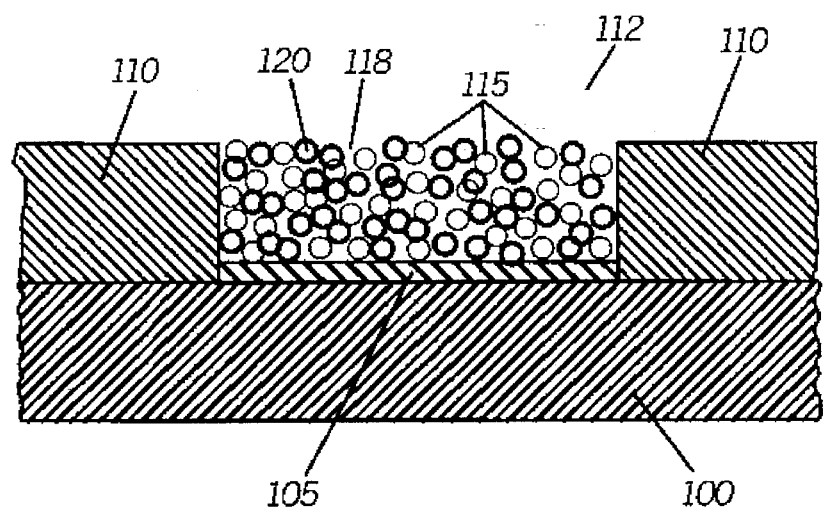
FIG. 2 is a cross sectional view of a circuit carrying substrate prior to heating, in accordance with the invention.
Figure 3:
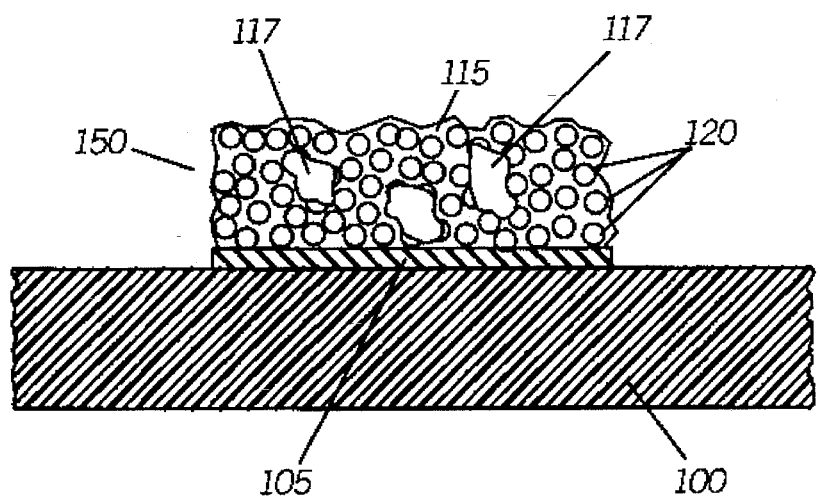
FIG. 3 is a cross sectional view of a circuit carrying substrate after heating, in accordance with the invention.

Reference is now concurrently made to the process flow diagram, FIG. 1, and a cross sectional view of the printed circuit board, FIG. 2. An insulating substrate 100 such as a PCB having a solderable surface 105 is provided, as shown in box 10. The printed circuit board 100 is then printed with the dual-alloy solder composition, as shown in box 20. The process of printing can be done in several different ways. In the preferred embodiment, a mask 110 having appropriately located openings 112 is placed on the PCB 100 so that the solderable surfaces 105 are exposed. The mask 110 is temporary, such as a stencil or a screen mesh typically used for printing solder paste. The dual-alloy solder paste, containing low temperature particles 115, high temperature particles 120 and additional components 118 such as fluxes or vehicles, is deposited in the openings 112 by printing the paste through the mask using a squeegee. After printing, the mask 110 is removed, leaving the deposit as shown in FIG. 3, and the dual-alloy solder paste is reflowed (box 30). During the reflow, the dual alloy solder paste is heated to a temperature such that the low temperature solder alloy 115 is melted or liquified, but the high temperature alloy 120 remains in its original and unmelted, solid state. In the preferred embodiment the peak reflow temperature would be about 165° C. At this temperature, only the low temperature solder alloy liquefies. The higher temperature solder spheres remain intact and, upon cooling (box 40) below its melt temperature, the low temperature solder alloy solidifies. This process of partially melting the mixture creates a solid solder mass having a substantially flat, textured surface. Additional operations may be performed on the reflowed circuit board to remove foreign materials, such as flux residue and excess solder balls. This is typically performed by cleaning with aqueous or organic cleaning agents. If the end product of the method is a printed circuit substrate, the operation is complete (boxes 50 and 60). At this point, the PCB 100 is clad with a thick, but uniform and flat layer of solder 150 on the solder pads 105. This layer of solder 150 consists of an aggregate-like structure of the unreflowed high temperature solder alloy particles 120 distributed within a matrix of the reflowed or melted low temperature solder alloy 115. The low temperature alloy 115 serves to 'bind' the unmelted high temperature alloy particles 120 together to form a single mass. In practice, some voids or empty spaces 117 may be formed in the solder mass upon cooling. These voids 117 are the result of inefficiencies in the packing of the solder particles and/or the volatiles evolved from the flux and vehicle during the heating process.

Although the exact mechanism taking place during the reflow process is not completely understood, it is postulated that the low temperature material has alloyed or formed a metallurgical bond to the high temperature solder material, thereby adding to the mechanical integrity of the resulting solder mass. The formation of the metallurgical bond is thought to occur by diffusion between the molten metal alloy and the solid metal during reflow.

Further operations may be performed with the solder clad PCB. For example, it may now be used in an assembly process similar to that used with conventional clad solid solder deposition printed circuit boards; that is, the surface is fluxed, as shown in box 70, and surface-mount components or parts are placed (box 80) at the desired locations with the solderable portions of the parts in contact with the reflowed soldering composition on the printed circuit board. Prior to placement of the parts on the circuit board, a solder flux or tacking agent may optionally be used. This solder flux or tacking agent is typically applied at selected locations in order to aid in fixturing the electronic components and also to aid in removing oxides from the solder surfaces. The rough and flat surface of the reflowed soldering composition aids in keeping the flux from spreading off the pad, and also aids in keeping the part in place on the pad. The flux application step 70 can be performed in any of a number of ways, such as spraying, roller coating, syringe dispensing, pin transfer mechanisms, and so forth, all known to those in the art. The parts are placed as shown in step 80, and the assembly is now reflowed at a temperature sufficient to reflow both the low temperature solder alloy and the high temperature solder alloy. This forms a solder fillet between the solderable portions of the component and the solderable portions of the printed circuit board. This reflow step is represented by box 30. As the temperature passes above 144° C., the low temperature alloy melts and as the temperature exceeds 180° C., the high temperature alloy also melts. The liquid alloys create substantial surface tension to provide self-centering of the surface mount components. At this point, the single sided assembly would be complete.

However, if additional parts are required to be placed on the circuit board, either on the same side or on the opposite side of the circuit board, another assembly operation occurs. In this case, a solder paste having still another composition would be used. In this case, the solder alloy would have different melting ranges. Preferably, the alloy(s) would have melting ranges or melting temperatures higher than those used in the first reflow operation. This soldering composition could be a single alloy, as is employed in conventional soldering processes, or it could be a dual alloy mixture using the same concept as explained above. After the reflow step for part placement 30, the board is again cooled down 40, and a soldering flux or tacking agent 70 is applied. The parts are placed in conventional manner either manually or by robots or automated placement machines 80, and the assembly is again reflowed. Multiple reflows are commonly performed in today's high-density, complex electronic assemblies.

Figure 4:
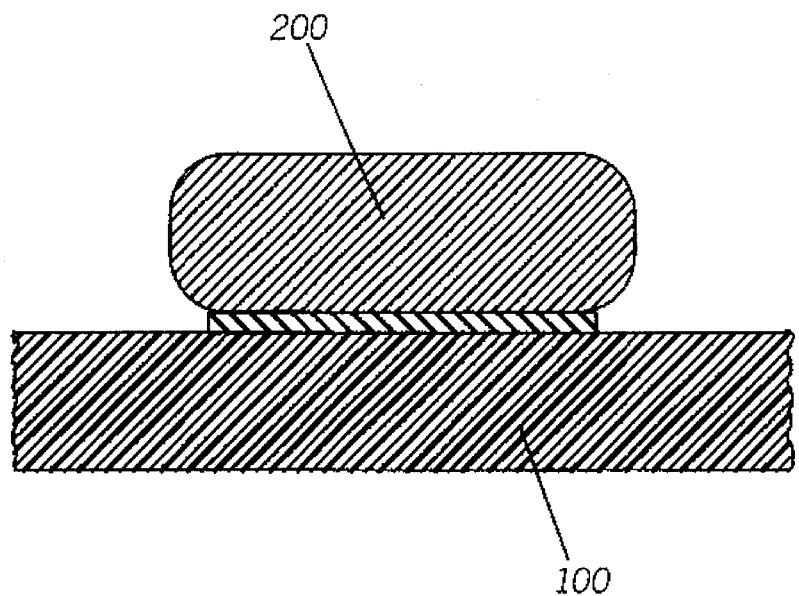
FIG. 4 is a cross sectional view of a circuit carrying substrate after a second heating step, in accordance with the invention.

Referring now to FIG. 4, during the high temperature reflow, both the low and high temperature materials melt to form a third alloy 200 that is essentially uniform throughout.

Figure 5:
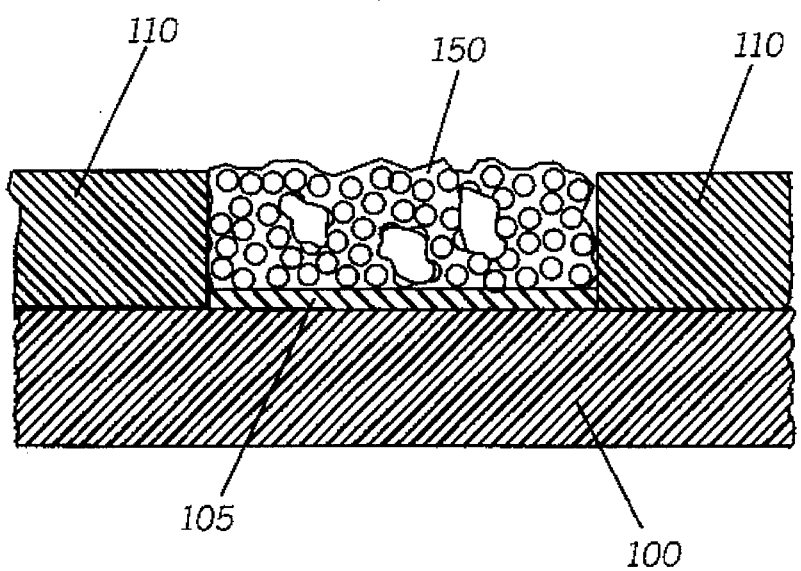
FIG. 5 is an alternate embodiment cross sectional view of a circuit carrying substrate after heating, in accordance with the invention.

An alternative embodiment of the invention employs a mask that is formed directly on the PCB. That is, the mask stays in place during the reflow step, creating a solder dam or well around the solderable surface to confine the soldering composition in the well. One example of the use of a solder dam is found in U.S. Pat. No. 5,024,372 by Altman et al., incorporated herein by reference. The solder dam eliminates the need for a solder stencil or solder screen. Optionally, the mask may be retained after the reflow operation in order to protect other circuitry on the PCB. As shown in FIG. 5, the mask 110 stays in place during reflow, confining the dual alloy solder composition 150 to the immediate area of the solderable pad 105.

Figure 6:
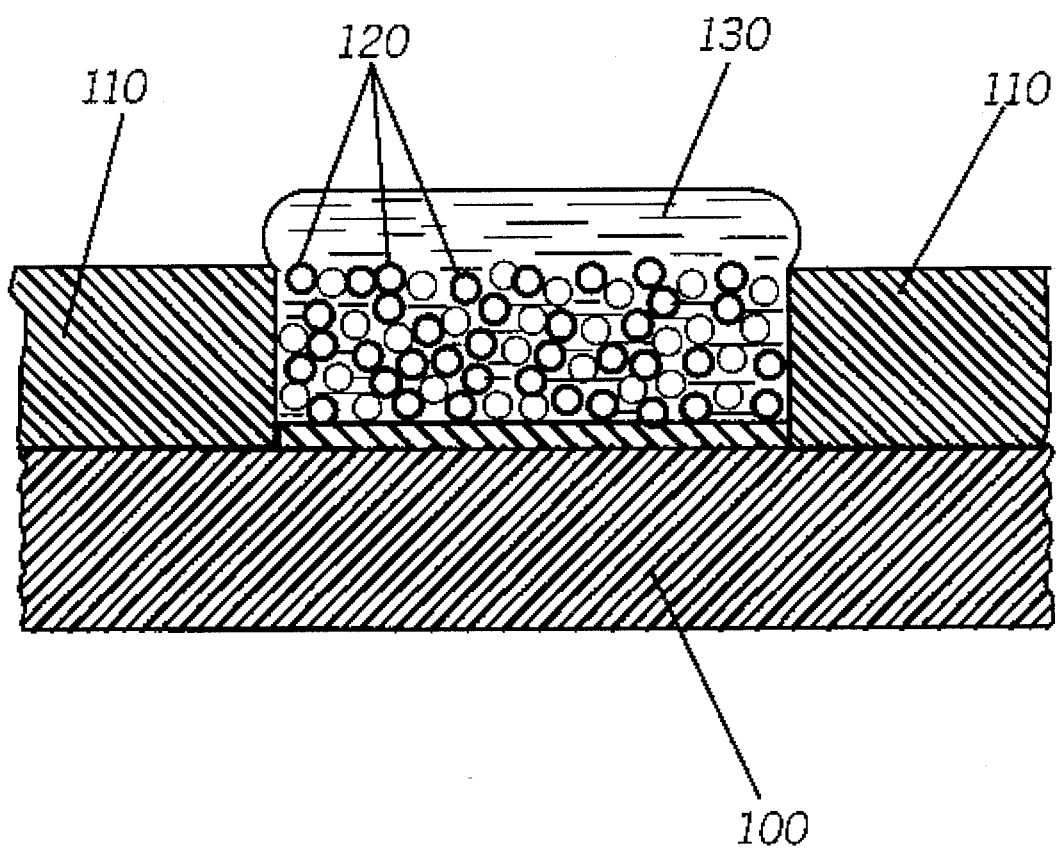
FIG. 6 is an alternate embodiment cross sectional view of a circuit carrying substrate prior to heating, in accordance with the invention.

Rather than using a solder paste having a vehicle and other components such as fluxes, particles of the two different solders can be simply deposited on the solderable pads 105. As shown in FIG. 6, a mixture consisting of just the particles of each solder alloy 115 and 120 is deposited in the openings of the mask 110. This eliminates the need for expensive solder paste, and permits the use of the solder powders. The deposition process can be by spraying, curtain coating or other means, and the excess can be easily wiped off the surface of the mask 110. Before the low temperature material 115 is melted, a fluxing agent 130 is applied over the deposited solder powder to aid in removing any oxides and promote wetting. After the reflow step where only the low temperature material is melted, the resulting structure resembles that shown in FIG. 5.

Clearly, it can be seen that this invention provides the advantage of the creation of flat, uniformly rough surfaces on the solderable portions of a printed circuit board due to the presence of unmelted particles of solder in the reflowed low-melting alloy. This creates a surface that is highly suitable for retention of any flux or tacking agent dispensed on the pad, whereas the domed surfaces found in conventional solder clad or reflowed PCBs are prone to flux loss by rolling or flowing off of the domed surfaces. Further, the flat surfaces of the solder provide better quality in the surface mounted component placement process, as the components do not slide off of the flat solder pads. Surface tension provided during the reflow operation also aids in self-centering the part on the pad. It can also be seen that this invention may be used to provide a solder clad printed circuit board or other type of substrate, and may further be used to provide an assembly process for assembling and soldering printed circuit assemblies soldering electronic components to the board, resulting in printed circuit assemblies.

While the preferred embodiments of the invention have been illustrated and described, it will be clear that the invention is not so limited. For example, the soldering composition could be provided on the nonsolderable portions of the substrate, so that after reflow, the soldering composition 150 does not adhere to the substrate. Numerous other modifications, changes, variations, substitutions and equivalents will occur to those skilled in the art without departing from the spirit and scope of the present invention as defined by the appended claims.

We claim:

1. A soldering method, comprising the steps of:

providing a substrate having solderable portions;

providing a soldering composition on the solderable portions, said soldering composition comprising:

a first solder material having a predetermined liquidus temperature; and a second solder material having a predetermined solidus temperature that is greater than the predetermined liquidus temperature of the first solder material;

heating the soldering composition above the first solder material liquidus temperature and below the second solder material solidus temperature, whereupon the first solder material liquifies and the second solder material remains solid; and cooling the soldering composition to solidify the first solder material.

2. The method of claim 1, further comprising:

a step of placing a part having solderable portions on the solidified solder composition; and a final step of heating the solidified solder composition to a temperature sufficient to liquify both the first and second solder materials, forming a metallurgical bond between the solderable portions of the substrate and the solderable portions of the part.

3. The method of claim 2, further comprising a step of applying a flux to the soldering composition prior to the step of placing a part.

4. The method of claim 1, wherein the step of providing a soldering composition further comprises;

providing a mask having openings corresponding to the solderable portions;

placing the mask on the substrate so that the openings are aligned with the solderable portions, to expose the solderable portions;

depositing the soldering composition in the mask openings, on the solderable portions.

5. The method of claim 4, further comprising a step of removing the mask after depositing the soldering composition in the mask openings and prior to the step of heating the soldering composition.

6. A soldering method, comprising:

providing a substrate having first and second opposing major sides, at least one side having solderable portions;

providing a soldering composition on the solderable portions of the substrate, said soldering composition comprising:

a first solder material having a predetermined liquidus temperature; and a second solder material having a predetermined solidus temperature that is greater than the predetermined liquidus temperature of the first solder material;

heating the soldering composition above the first solder material liquidus temperature and below the second solder material solidus temperature, whereupon the first solder material liquifies and the second solder material remains solid;

placing a part having solderable portions on the solder composition, such that the solderable portions of the part are in contact with the soldering composition; and heating the solder composition to a temperature sufficient to liquify the second solder material, forming a metallurgical bond between the solderable portions of the substrate and the solderable portions of the part.

7. The method of claim 6, further comprising:

a step of cooling the soldering composition to solidify it, prior to the step of placing a part.

8. The method of claim 7, further comprising:

applying a flux to the soldering composition, prior to the step of placing a part.

9. A soldering method, comprising:

providing a substrate having first and second opposing major sides, and having solderable portions on each of said sides;

providing a soldering composition on the solderable portions of both sides of the substrate, said soldering composition comprising:

a first solder material having a predetermined liquidus temperature; and a second solder material having a predetermined solidus temperature that is greater than the predetermined liquidus temperature of the first solder material;

heating the soldering composition above the first solder material liquidus temperature and below the second solder material solidus temperature, whereupon the first solder material liquifies and the second solder material remains solid;

placing a first part having solderable portions on the first side of the substrate, such that said solderable portions are in contact with the soldering composition;

heating the soldering composition to a temperature sufficient to liquify the second solder material;

placing a second part having solderable portions, on the substrate, such that said solderable portions are in contact with the soldering composition; and heating the solder composition to a temperature sufficient to liquify the second solder material.

10. The method of claim 9, further comprising:

a step of cooling the soldering composition to solidify it, prior to the step of placing a first part.

11. The method of claim 9, further comprising:

applying a flux to the soldering composition, after the step of cooling.

12. The method of claim 9, further comprising:

a step of cooling the soldering composition to solidify it, prior to the step of placing a second part.

13. The method of claim 10, further comprising:

applying a flux to the soldering composition, after the step of cooling.

14. The method of claim 9, wherein the step of providing a soldering composition includes solder materials comprising about 12% by weight of the first solder material and about 88% by weight of the second solder material.

15. A soldering method, comprising the steps of:

a) depositing a solder paste on solderable surfaces of a printed circuit board, said solder paste comprising:

first solder particles, consisting essentially of tin, lead and silver, and having a melting temperature of about 180° C.;

second solder particles having a melting temperature less than 180° C.; and a fluxing agent; and b) heating said solder paste at a temperature sufficient to cause only said second solder particles to reflow, thereby creating a soldering composition having the second solder particles arranged within a matrix of the melted first solder material, forming a solder mass.

16. The method of claim 15, further comprising a step of:

c) cooling said heated solder paste to solidify it.

17. The method of claim 16, further comprising a step of:

d) soldering an electronic component to portions of said printed circuit board solderable surfaces, at a temperature sufficient to cause said first solder particles to reflow.

18. The method of claim 17, further comprising a step of applying flux on said solidified solder prior to soldering said component.

19. The method of claim 17, further comprising an additional step of:

e) soldering an electronic component to other portions of said printed circuit board solderable surfaces, at a temperature sufficient to cause both said first and second solder particles to reflow.

20. The method of claim 19, further comprising a step of applying flux on said solidified solder prior to soldering said component.

21. The method of claim 15, wherein the step of providing a solder paste includes solder particles comprising about 12% by weight of the first solder particles and about 88% by weight of the second solder particles.

22. A method of manufacturing a solder clad circuit board, comprising the steps of:

applying a mixture of at least first and second types of solder particles to the board, the first and second types of solder particles having different melting temperatures; and heating the mixture to a temperature where one of said types melts and the other of said types does not yet melt, and cooling the mixture.

* * * * *